United States Patent [19]
Lin

[11] Patent Number: 5,216,283
[45] Date of Patent: Jun. 1, 1993

[54] SEMICONDUCTOR DEVICE HAVING AN INSERTABLE HEAT SINK AND METHOD FOR MOUNTING THE SAME

[75] Inventor: Paul T. Lin, Austin, Tex.

[73] Assignee: Motorola, Inc., Schaumburg, Ill.

[21] Appl. No.: 519,375

[22] Filed: May 3, 1990

[51] Int. Cl.⁵ .................. H01L 23/36; H01L 23/38; H01L 23/30

[52] U.S. Cl. .................... 257/787; 257/708; 257/788; 257/796; 257/717

[58] Field of Search .............. 257/787, 796, 717; 357/81, 72

[56] References Cited

U.S. PATENT DOCUMENTS

| | | | |
|---|---|---|---|
| 4,642,716 | 2/1987 | Wakabayashi et al. | 357/81 |
| 4,777,520 | 10/1988 | Nambu et al. | 357/72 |
| 4,823,234 | 4/1989 | Konishi et al. | 357/ |
| 4,826,741 | 5/1989 | Aldhart et al. | 429/19 |
| 4,866,506 | 9/1989 | Nambu et al. | 357/72 |
| 4,890,152 | 12/1989 | Hirata et al. | 357/72 |
| 4,918,571 | 4/1990 | Grabbe | 357/81 |

FOREIGN PATENT DOCUMENTS

| | | | |
|---|---|---|---|
| 2456390 | 12/1980 | France | |
| 56-16458 | 12/1981 | Japan | |
| 57-107063 | 7/1982 | Japan | |
| 57-211259 | 12/1982 | Japan | |
| 60-63952 | 4/1985 | Japan | 357/81 |
| 60-136348 | 7/1985 | Japan | 357/81 |
| 61-212045 | 9/1986 | Japan | |
| 63-65657 | 3/1988 | Japan | 357/74 |
| 63-117463 | 5/1988 | Japan | |
| 63-133555 | 6/1988 | Japan | |
| 63-200549 | 8/1988 | Japan | 357/81 |
| 1-20643 | 1/1989 | Japan | |
| 1-244652 | 9/1989 | Japan | 357/74 |
| 1-293551 | 11/1989 | Japan | |

Primary Examiner—Eugene R. LaRoche
Assistant Examiner—Viet Q. Nguyen
Attorney, Agent, or Firm—Jasper W. Dockrey

[57] ABSTRACT

A semiconductor device is disclosed having an electronic component mounted to a mounting surface opposite a heat transfer surface of a die support member. The electronic component includes a plurality of bonding pads each electrically coupled to a plurality of package leads by a number of inner leads. A package body encloses the electronic component, the inner leads, the proximal ends of the package leads and the mounting surface of the die support member. The package body includes an opening exposing a portion of the heat transfer surface of the die support member. An insertable thermally conductive heat sink extends into the opening in the package body making thermal contact with the heat transfer surface of the die support member. A thermally conductive electrically insulating adhesive joins the heat sink to the package body securing the heat sink to the package body. In the assembly process, the package body is formed prior to attachment of the heat sink. During the process of soldering the package leads of the semiconductor device to a mounting substrate, gasses within the package body can escape through the opening before excessive pressure buildup occurs within the package body.

8 Claims, 4 Drawing Sheets

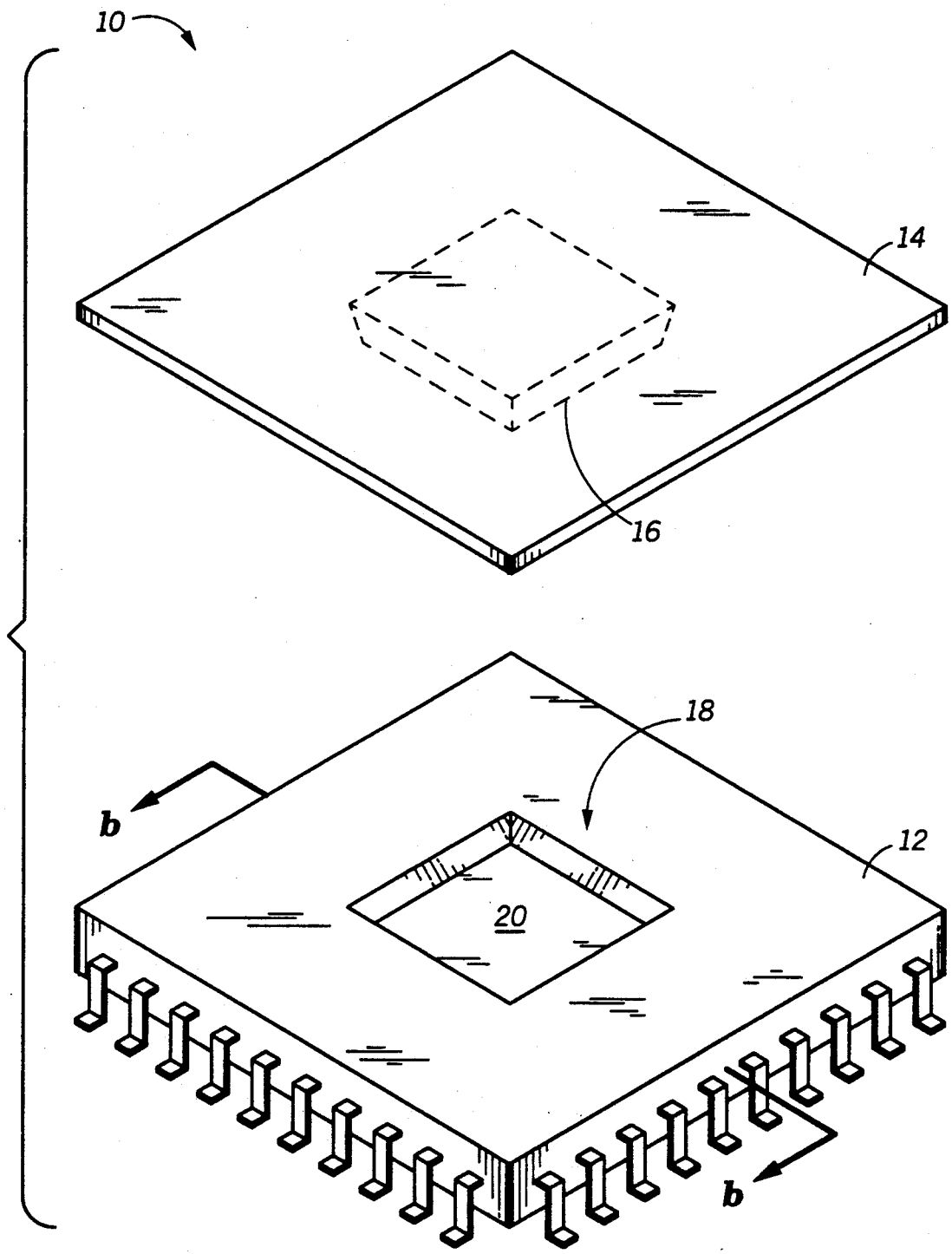
FIG.1-a

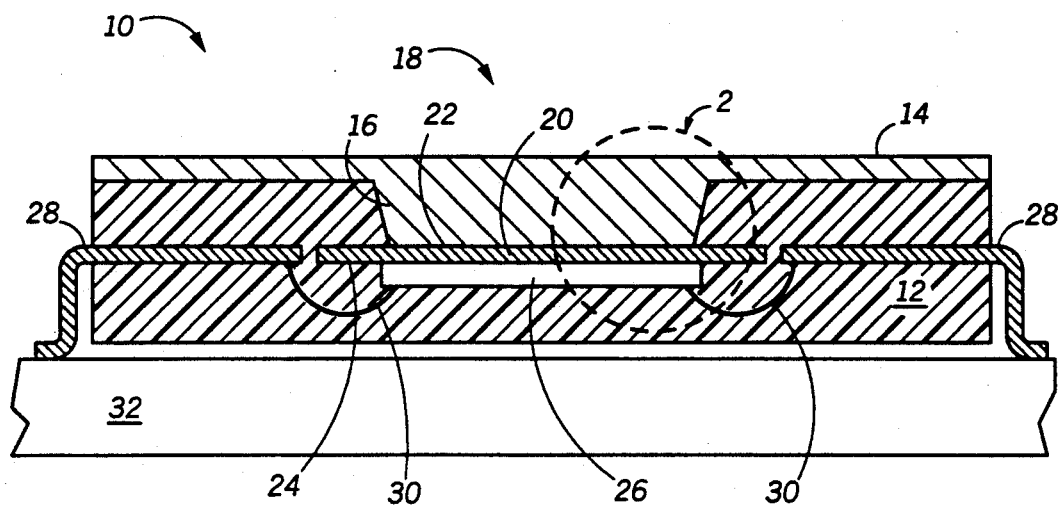
*FIG.1-b*
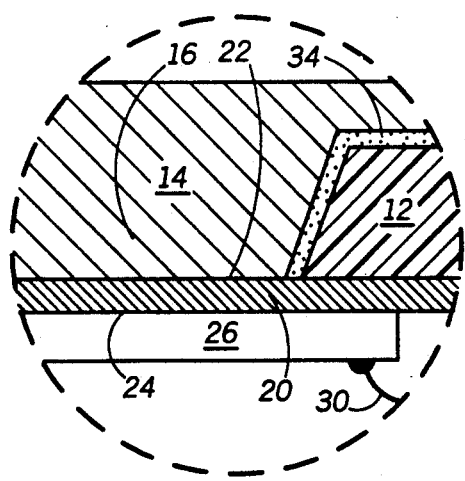   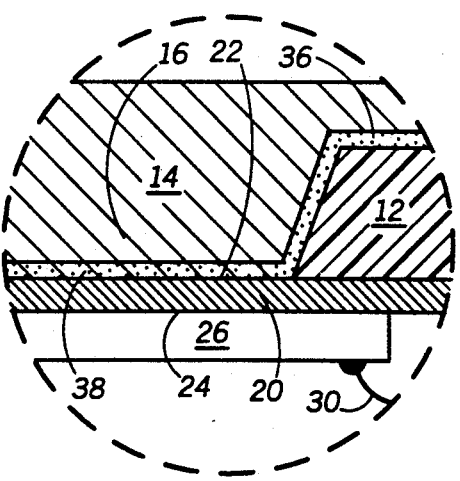
*FIG.2-a*   *FIG.2-b*

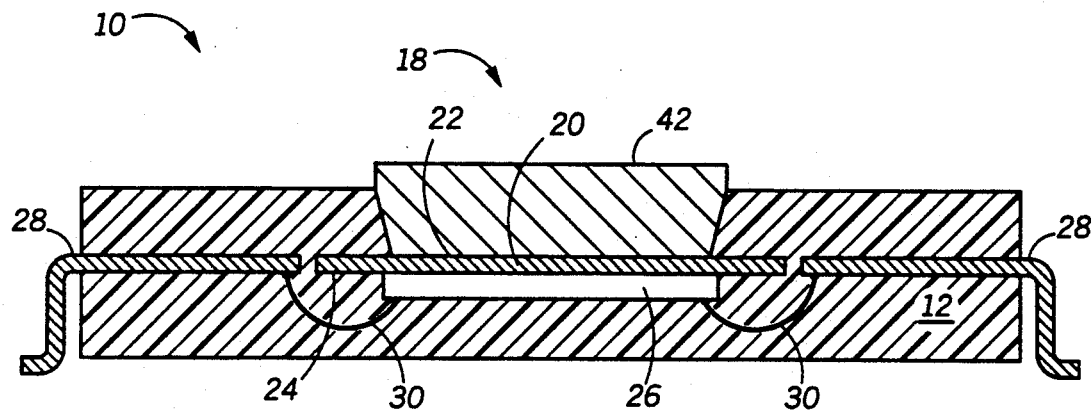
FIG.4-a
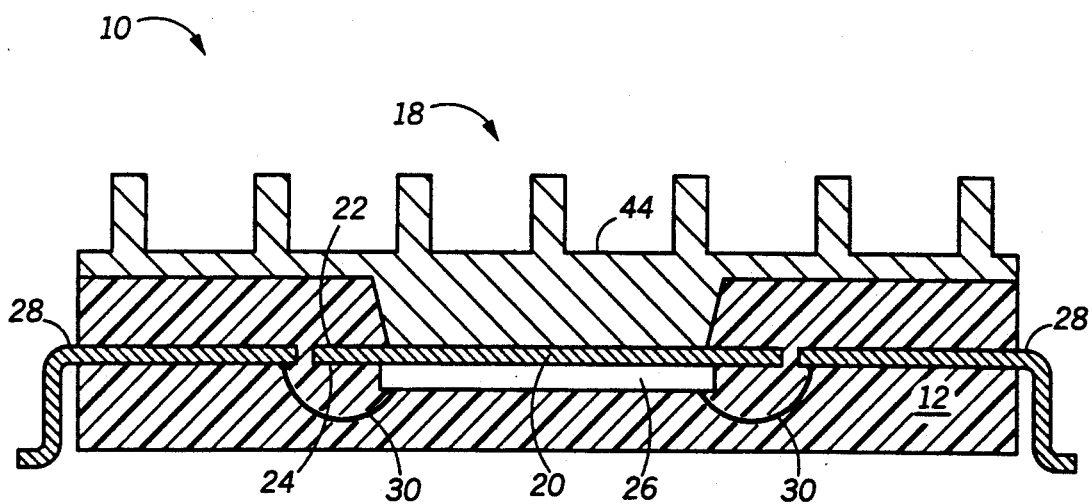
FIG.4-b

SEMICONDUCTOR DEVICE HAVING AN INSERTABLE HEAT SINK AND METHOD FOR MOUNTING THE SAME

CROSS-REFERENCE TO RELATED APPLICATION

Related subject matter is disclosed in U.S. patent application Ser. No. 07/450,763 entitled "Molded Electronic Package With Compression Structures", filed Dec. 14, 1989 and assigned to the assignee hereof.

BACKGROUND OF THE INVENTION

This invention relates in general to semiconductor devices and more particularly to semiconductor devices having packages including thermal dissipation structures and pressure venting capability.

Packaging for state of the art VLSI devices requires consideration for the dissipation of heat generated by the enclosed electronic component. Excessive heating during operation accelerates the rate of temperature sensitive failure mechanisms such as electromigration, bond fatigue, metal corrosion, and others. The most common method for providing thermal dissipation is to incorporate a heat sink into the package body that is in close proximity to the heat producing electrical component and molded into the package body. While the use of a heat sink provides an effective means of controlling the temperature of the semiconductor device during operation, problems exist with the implementation of a heat sink. The need for good thermal dissipation requires a large, thermally conductive body having a extensive surface area for heat transfer. The large volume of the heat sink can represent a limitation to the use of the semiconductor device in user systems with small dimensional requirements. Additionally, the large internal surface area of the heat sink, sealed to the package body by a conventional injection molding process, presents an extensive area upon which water and solvents, which have permeated through the package body and overlying adhesive layers, can condense and eventually vaporize causing catastrophic failure of the semiconductor device.

During the process of attaching a semiconductor device to a mounting substrate, such as a printed circuit board, a particular problem that must be considered is the potential for pressure buildup within the package body. Water and residual solvents trapped within the package body during the molding process or that have permeated through the package body, vaporize when the package body temperature rises, for example, when the package leads of the semiconductor device are soldered to contact lands on the printed circuit board. During the board mounting process the package body temperature can easily rise to temperatures in the range of 200° to 250° C. At these temperatures any water and many solvents within the package that have permeated through the package body and condensed on metallic or plastic surfaces, or within the package, will vaporize and can generate sufficient internal pressure to crack the package body. Package body cracking or rupture, as a result of internal gas pressure buildup is known in the art as "pop corn cracking" and can represent a major reliability problem.

Packages containing large metallic bodies, such as packages containing heat sinks or heat spreaders, present a large surface area upon which water and solvents may condense and thus are prone to large internal pressure buildup during board mounting. In a conventional assembly process, a heat sink is placed in the mold in close proximity to the integrated circuit device that is to be encapsulated. A mold compound is then injected into the mold enclosing the heat sink within the package body and sealing the metallic surface of the heat sink to the package body. Any water or residual solvents trapped within the package then can condense on the metal surface of the heat sink along the interface between the heat sink and the package body. The potential for gas pressure rupturing of the package body is increased by the large amount of metal surface area available for condensation to take place.

In an attempt to provide an effective heat sink which requires a large surface area for heat transfer to the ambient environment, heat sinks are often configured to have large portions that protrude well beyond the outer surface of the package body. The additional volume, away from the package body, that is occupied by the heat sink can present a problem for the user, who must often mount the semiconductor device on a printed circuit board that will be installed into a system having many tightly spaced printed circuit boards. The amount of head space between adjacent printed circuit boards varies greatly from one system to the next. Typically, the user wants to use the largest heat sink permitted by the application, however, semiconductor devices with heat sinks molded into the package body can limit the selection based upon the external dimensions of the heat sink rather than the particular performance characteristics of the enclosed electronic component. It would be advantageous if the user could select a heat sink profile that would be best suited to the amount of head space available in a particular system.

Thus, a continuing goal in the art of providing semiconductor devices having packages with thermal dissipation capability is a semiconductor device that will address these problems satisfactorily in an arrangement that can be readily manufactured at a low cost. It would be advantageous if a semiconductor device existed having good thermal dissipation capability with the ability to meet varying user space requirements and an ability to relieve internal gas pressure to avoid cracking or rupture of the package body.

BRIEF SUMMARY OF THE INVENTION

An object of the invention is to provide an improved semiconductor device having thermal dissipation capability and means for relieving pressure buildup within the package during board mounting.

Another object of the invention is to provide an improved semiconductor device having user selectable heat dissipation means.

Yet another object of the invention is to provide an improved process for mounting a semiconductor device to a mounting substrate.

These and other objects and advantages of the invention are achieved, in according to the invention, by a semiconductor device having an insertable heat sink positioned into an opening in the package body. The opening in the package body exposes a heat transfer surface of a die support member partially encapsulated within the package body. During the process of soldering the package leads of the semiconductor device to a mounting substrate, gasses within the package body can escape through the opening before excessive pressure buildup occurs within the package body. According to one embodiment of the invention, a semiconductor device is provided having an electronic component mounted to a mounting surface opposite a heat transfer surface of a die support member. The electronic component includes a plurality of bonding pads each electrically coupled to a plurality of package leads by a number of inner leads. A package body encloses the electronic component, the inner leads, the proximal ends of the package leads and the mounting surface of the die support member. The package body includes an opening exposing a portion of the heat transfer surface of the die support member. An insertable thermally conductive heat sink extends into the opening in the package body making thermal contact with the heat transfer surface of the die support member. A thermally conductive electrically insulating adhesive joins the heat sink to the package body securing the heat sink to the package body. In the assembly process, the package body is formed prior to attachment of the heat sink. At this point, a heat sink may be attached to the package body, or alternatively, the user can select the exact dimensions of the heat sink from a number of options depending upon the system requirements in which the semiconductor device is used, and can insert the heat sink into the package body upon delivery.

BRIEF DESCRIPTION OF THE DRAWINGS

FIG. 1-a is an exploded isometric view of a semiconductor device, according to one embodiment of the present invention, having an insertable heat sink;

FIG. 1-b is a cross sectional view of the semiconductor device shown in FIG. 1-a taken along the line b—b;

FIG. 2-a is a detailed view of a portion of the semiconductor device illustrated in FIG. 1-b taken in area 2 showing one embodiment of an adhesive layer joining the heat sink to the package body;

FIG. 2-b is a detailed view of a portion of the semiconductor device illustrated in FIG. 1-b taken in area 2 showing an alternative embodiment of an adhesive layer joining the heat sink to the package body;

FIG. 4-a illustrates, in cross section, a alternative embodiment of a semiconductor device according to the invention having a plug shaped heat sink; and FIG. 4-b illustrates, in cross section, another alternative embodiment of the invention having a heat sink with a convoluted surface profile.

Figure 3:
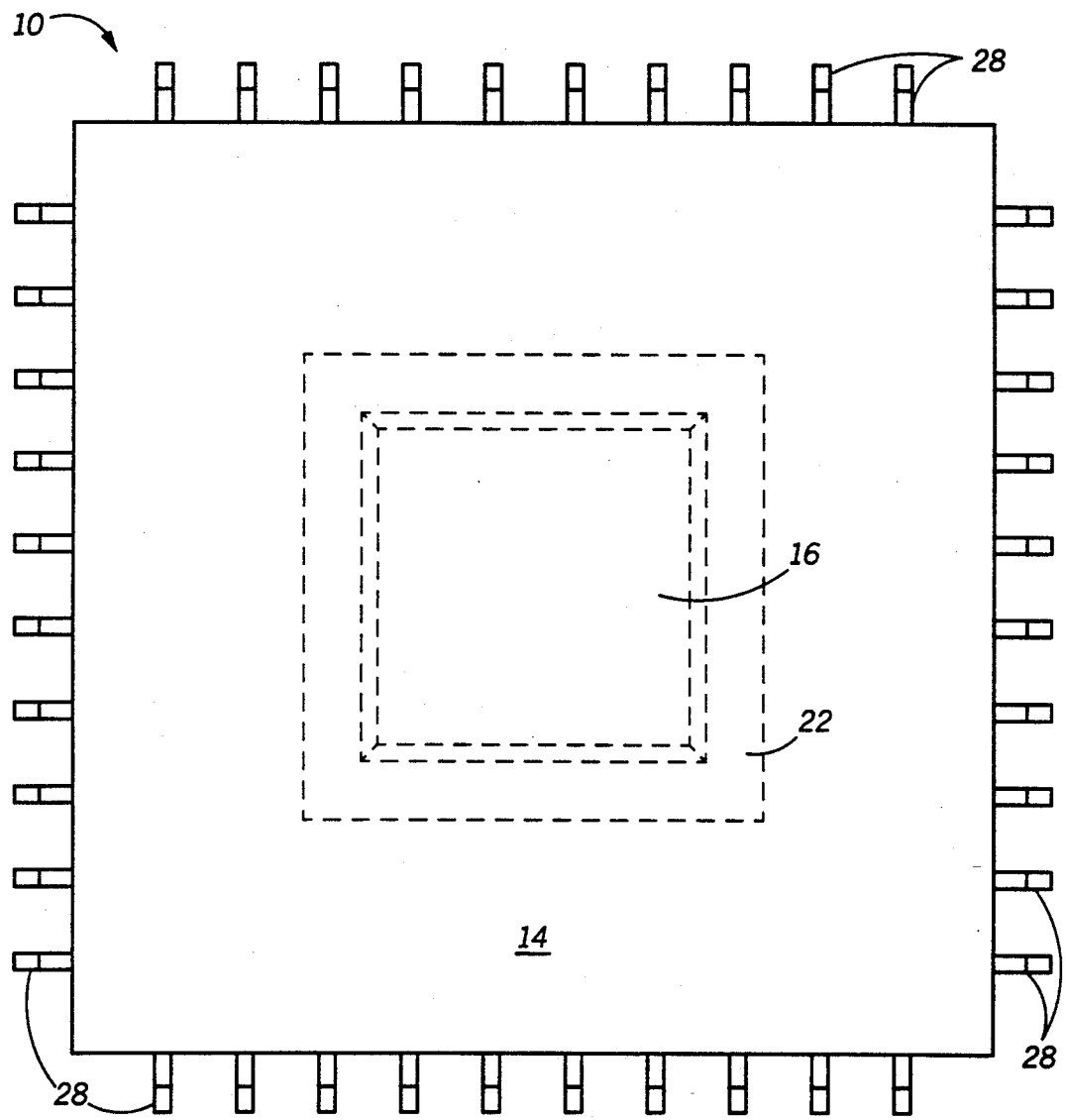
FIG. 3 shows a top view of semiconductor device according to one embodiment of the invention.

It will be appreciated that in the Figures the proportions of the various parts are not to scale. For example, the dimensions of some of the elements are exaggerated relative to each other for clarity.

DETAILED DESCRIPTION OF THE PREFERED EMBODIMENTS

The invention will now be described in detail with reference to the FIGURES. Shown in FIG. 1-a is an exploded view of a semiconductor device 10 according to one embodiment of the invention, comprising a package body 12 containing an electronic component (not shown) and an insertable heat sink 14. Heat sink 14 has an insertable portion 16 for insertion into an opening 18 in package body 12. Package body 12 is constructed from a molded plastic material such as a filled epoxy novolac resin, a silicone polymer, or the like and is molded as a quad-flat-package (QFP). Alternatively, package body 12 can be constructed from a filled ceramic material such as alumina or aluminum nitride, or the like, and can be molded into other package body types such as, for example, a dual-in-line package (DIP), leadless-chip-carrier (LCC), or the like. Heat sink 14 is constructed from a material having high thermal conductivity such as a metal or a metallic composite material. Heat sink 14 is preferably constructed from a aluminum (Al)-filled polymer however, other metals having a high thermal conductivity can be used such as aluminum, copper, gold, or the like and alloys thereof. Additionally, non-metallic thermally conductive materials such as fused silica, and boron nitride and the like can be used as a fill material in heat sink 14. Heat sink 14 is cast into a shape compatible with the outline of package body 12 so that heat sink 14 can directly overlie package body 12 with insertable portion 16 fitting snugly into opening 18. Insertable portion 16 makes contact with a die support member 20 which is exposed and visible through opening 18 in package body 12. Opening 18 has a smooth wall surface having a uniformly positive slope inclined at about 13 to 18 degrees from vertical beginning at die support member 20. The smooth, uniformly positive wall surface of opening 18 allows heat sink 14 to be easily inserted into package body 12.

A cross sectional view of the assembled semiconductor device 10 taken along the line b—b in FIG. 1-a is shown in FIG. 1-b. Die support member 20 includes a heat transfer surface 22 making thermal contract with insertable portion 16 of heat sink 14, and a mounting surface 24 opposite heat transfer surface 22. Die support member 20 is constructed from a thermally conductive material such as alloy 42, copper, or the like. An electronic component 26 is bonded to mounting surface 24 by a die bond adhesive such as a thermoset resin, a filled epoxy, or the like. Electronic component 26 can be an integrated circuit device such as an applications specific integrated circuit (ASIC) device, a memory device such as a static-random-access-memory (SRAM) or a dynamic-random-access-memory (DRAM), a high power device such as a discrete device or a TTL device, such as a bi-polar memory device, or the like. Electronic component 26 is electrically connected to a plurality of package leads 28 by a series of inner leads 30 which extend from bonding pads (not shown) on the face of electronic component 26 to the proximal ends of package leads 28. The distal ends of package leads 28 are forged into a shape suitable for mounting semiconductor device 10 to a mounting substrate 32. As illustrated in FIG. 1-b, the distal ends of package leads 28 are forged into a gull-wing shape and make contact with contact lands (not shown) on the surface of mounting substrate 32.

The attachment of heat sink 14 to package body 12, in accordance with one embodiment of the invention, is depicted in expanded detail in FIG. 2-a which shows a portion of the interface between package body 12 and heat sink 14 denoted as area 2 in FIG. 1-b. A layer of thermal grease 34 overlies package body 12 separating heat sink 14 from package body 12. Preferably thermal grease 34 exclusively overlies package body 12 and does not overlie heat transfer surface 22 of die support member 20. It is important that the transfer of heat between die support member 20 and heat sink 14 not be restricted by any material having poor thermal conductivity. Accordingly, it is preferred that heat sink 14 be in intimate thermal contact with heat transfer surface 22 such that heat generated by electronic component 26 is readily transferred to heat sink 14. Thermal grease 34 is preferably a thermally conductive adhesive material such as EPOTEK H71-F.

Another factor governing the amount of heat transfer occurring between heat transfer surface 22 and heat sink 14 is the amount of surface area available for heat transfer. Opening 18 is preferably of sufficient dimensional area to permit efficient heat transfer between heat transfer surface 22 and heat sink 14. In one embodiment of the invention, opening 18 in package body 12 exposes a substantial portion of heat transfer surface 22.

In certain applications it is desirable to increase the adhesion between heat sink 14 and package body 12 by using an adhesive layer directly overlying heat transfer surface 22. To insure that excessive resistance to heat flow does not occur, the adhesive layer overlying heat transfer surface preferably has a thermal conductivity approaching that of a metal, such as one of the metals previously described. An alternative bonding structure for attaching thermal sink 14 to package body 12 using a boron-nitride filled epoxed layer 36 is shown in expanded detail in FIG. 2-2. A portion 38 of the epoxy layer 36 overlies heat transfer surface 22 providing a thermally conductive adhesive body between heat transfer surface 22 and heat sink 14.

An important aspect of the bonding means used to attach heat sink 14 to package body 12 is that the bonding composition permit water vapor trapper within the package body to escape to the ambient atmosphere during the process of soldering the distal ends of package leads 28 to mounting substrate 32. The soldering process commonly used to perform board attach typically proceeds at temperatures above 200° C. At these temperatures, water vapor trapped within the package body vaporizes causing a large gas pressure buildup within the package body. The inventive method of attaching heat sink 14 to package body 12, after the molding process has previously been completed, takes advantage of the pressure venting capability provided by opening 18 to vent gasses through thermal grease 34, or in the alternative, through epoxy layer 36 during lead soldering. The venting of gasses from package body 12 during lead soldering, prevents the cracking or rupture of package body 12 resulting from excess pressure buildup within semiconductor device 10.

A top view of the embodiment illustrated in FIG. 1-b is shown in FIG. 3. The relative position of insertable portion 16 to die support member 20 is shown in a QFP type package. Although a OFP type package is shown in FIG. 3, one skilled in the art will appreciate that other package types such as a DIP or LCC can make use of the inventive structure described herein.

In general, the procedure for assembling semiconductor device 10 involves bonding electronic component 26 to die support member 20 and attaching inner leads 30 to bonding pads (not shown) on the face of electronic component 26 and to the proximal ends of package leads 28 forming an intermediate assembly. The intermediate assembly is then placed into a mold having a first and second opposing surfaces where the first opposing surface is against die support member 20. The mold is closed and an electrically insulating compound, such as that previously described, is injected into the mold to encapsulate electronic component 26, inner leads 30 and the proximal ends of package leads 28. The position of the first opposing surface of the mold, against die support surface 20, prevents the injected insulating compound from contacting heat transfer surface 22, thus creating the configuration of package body 12 illustrated in the FIGURES. Following the formation of the molded assembly, package leads 28 are separated from any temporary connecting structures and forged into a shape suitable for mounting semiconductor device 10 to a mounting substrate, such as a printed circuit board.

At this point heat sink 14 may be joined to package body 12 by applying thermal grease 34 and insertion into opening 18, or alternatively, the molded assembly may be soldered to a mounting substrate before attaching heat sink 14 to package body 12. The inventive configuration of heat sink 14 and package body 12 has the advantage of greatly expanding the options for achieving heat dissipation in both the process of making semiconductor device 10 and mounting semiconductor device 10 to a printed circuit board. A user may, for example, choose a heat sink configuration that meets a certain dimensional requirement in order to place semiconductor device 10 in a specific location within the user system. Alternatively, the user may decide not to insert heat sink 14 into package body 12 in order to fit semiconductor device 10 into a system having very closely spaced printed circuit boards.

Representative examples of different styles of heat sinks which can be inserted into package body 12 are illustrated in FIGS. 4-a and 4-b. A heat sink 42 having a plug type profile inserted into opening 18 of package body 12 is shown in FIG. 4-a. Illustrated in FIG. 4-b is a heat sink 44 having a convoluted profile for increasing the surface area of heat sink 44 which is exposed to the ambient atmosphere. It will be apparent to one skilled in the art that many different styles of heat sinks having a variety of surface profiles can be used in the present invention.

Thus it is apparent that there has been provided, in accordance with the invention, a semiconductor device and a method for assembling and mounting a semiconductor device to a mounting substrate which fully meets the objects and advantages set forth above. Although particular embodiments of the invention have been described in the foregoing description, it will be apparent to one skilled in the art that numerous modifications and variations can be made to the presented embodiments which still fall within the spirit and scope of the invention. For example, the electronic component may be mounted on a die support member in a face-up orientation and an opening in the package body then exposes a portion of the die support member on the board mounting side of the package. Furthermore, the opening in the package body, and correspondingly the insertable portion of the heat sink, can have a shape other than that shown in the FIGURES. For example, the opening can be circular shaped, oval shaped, or the like. Accordingly, it is intended that all such variations and modifications as fall within the scope of the appended claims and equivalents thereof be included within the invention.

I claim:
1. A low profile semiconductor device comprising:
  a die support member having a mounting surface opposite a heat transfer surface;
  an electronic component bonded to the mounting surface of the die support member, the electronic component having a plurality of bonding pads thereon;
  a plurality of package leads having proximal ends electrically coupled to the bonding pads on the electronic component and distal ends extending outwardly therefrom;

a molded package body encapsulating the electronic component, the mounting surface of the support member and the proximal ends of the package leads, the package body having an upper surface and a tapered opening exposing at least a portion of the heat transfer surface of the die support member wherein the tapered opening has a smooth wall surface extending from the heat transfer surface of the die support member to the upper surface of the package body, the wall surface having a uniformly positive slope inclined at about 13 to 18 degrees from vertical whereby the larger dimension of the tapered opening is at the upper surface of the package body; and an insertable heat sink extending into the opening in the package body and making thermal contact with a thermally conductive polymer adhesive overlying at least the upper surface of the package body, wherein the polymer adhesive is permeable to high pressure water vapor within the package.

2. The semiconductor device of claim 1 wherein the polymer adhesive comprises a layer of thermal grease disposed between the package body and the heat sink.

3. The semiconductor device of claim 1 wherein the polymer adhesive comprises a boron-nitride filled polymer overlying the package body and the heat transfer surface.

4. The semiconductor device of claim 1 wherein the distal ends of the package leads extend outwardly beyond the edges of the package body and are forged into a shape suitable for surface mounting the semiconductor device to a mounting substrate.

5. The semiconductor device of claim 1 wherein the die support member is constructed of a material selected from the group consisting of copper and alloy 42.

6. The semiconductor device of claim 1 wherein the heat sink is constructed from a material selected from the group consisting of aluminum, copper and alloys thereof.

7. The semiconductor device of claim 1 wherein the heat sink is constructed from a polymer resin filled with a thermally conductive material selected from the group consisting of aluminum, copper, gold, fused silica, and boron nitride and alloys thereof.

8. A semiconductor device having a low profile thermally conductive package comprising:

a die support member having a mounting surface opposite a heat transfer surface;

an electronic component bonded to the mounting surface of the die support member, the electronic component having a plurality of bonding pads thereon;

a plurality of package leads having proximal ends electrically coupled to the bonding pads on the electronic component and distal ends extending outwardly therefrom;

a molded package body encapsulating the electronic component, the mounting surface of the support member and the proximal ends of the package leads, the package body having an upper surface;

a tapered opening in the package body exposing at least a portion of the heat transfer surface of the die support member wherein the tapered opening has a smooth wall surface extending from the heat transfer surface of the die support member to the upper surface of the package body, the wall surface having a uniformly positive slope inclined at about 13 to 18 degrees from vertical whereby the larger dimension of the tapered opening is at the upper surface of the package body;

an insertable heat sink extending into the opening in the package body and making thermal contact with the heat transfer surface of the die support member wherein the insertable heat sink has an tapered insertion portion configured for insertion into the tapered opening from above the upper surface of the package body; and a thermally conductive boron-nitride filled polymer adhesive layer overlying the upper surface of package body surrounding the tapered opening and joining the heat sink and the package body wherein the polymer adhesive is permeable to high pressure water vapor within the package.

* * * * *